United States Patent [19]

Chaki

[11] Patent Number: 4,503,720
[45] Date of Patent: Mar. 12, 1985

[54] PUSHBUTTON-OPERATED WAVEBAND OR STATION SELECTOR

[75] Inventor: Takao Chaki, Tokyo, Japan

[73] Assignee: Clarion Co., Ltd., Tokyo, Japan

[21] Appl. No.: 361,170

[22] Filed: Mar. 24, 1982

[30] Foreign Application Priority Data

Mar. 31, 1981 [JP] Japan .................................. 56-47857

[51] Int. Cl.$^3$ ........................... F16H 35/18; H03J 5/06
[52] U.S. Cl. ................................... 74/10.33; 74/10.37; 334/7
[58] Field of Search ..................... 74/10.33, 10.37, 104; 334/7

[56] References Cited

U.S. PATENT DOCUMENTS 3,270,624  9/1964  Blaney ..................................... 74/104
4,204,179  5/1980  Kataoka et al. ..................... 74/10.33

Primary Examiner—Lawrence J. Staab
Assistant Examiner—Michael J. Gonet
Attorney, Agent, or Firm—Flynn, Thiel, Boutell & Tanis

[57] ABSTRACT

A pushbutton-operated waveband or station selector which comprises a three-armed link with three arms pivotally disposed on a frame of the station selector by means of a pivotal shaft; the first and third arm at the opposite ends of the three-armed link being formed with guide portions for being slidably coupled with guide portions formed in a first and third members for movement to different directions and extending perpendicularly to the moving directions, the second arm at the center of the three-armed link being formed with a guide portion for being slidably coupled with a second member for movement to a different direction from those of the first and third members and extending perpendicularly of the moving direction of the second member.

4 Claims, 5 Drawing Figures

PUSHBUTTON-OPERATED WAVEBAND OR STATION SELECTOR

BACKGROUND OF THE INVENTION

The present invention relates to a pushbutton-operated waveband or station selector or tuner and more-particularly to improvements in the link mechanism.

In the pushbutton-operated waveband or station selector, as a selected pushbutton is depressed, the memory plate is moved and coupled with the core slide so that the pressure applied to the pushbutton is transmitted to the core slide on which a core is fitted, this core being thus inserted into or extracted out of the tuning coil, or as the manual tuning knob is turned, it causes the core slide to move so as to change the inserted position of the core inside the tuning coil. In many of such conventional techniques, the core slide on which the coil is secured moves in a direction different from that in which the memory plate moves to shift the core slide or the tuning shaft-side shifting member. For example, the memory plate and the tuning knob-side shifting member are so disposed as to be movable in the direction of the pushbutton width, while the core slide is so disposed as to be movable in the direction perpendicular (front-rear direction of the pushbutton) to the moving direction of the memory plate and tuning knob-side shifting member. Therefore, in order to operatively couple these members, there is provided between them a link which provides for an operative coupling of them and changes the moving directions of them.

In the conventional pushbutton-operated waveband or station selector, two members for shifting toward different directions from each other are operatively connected by means of an L shape link with two arms. However, a pushbutton-operated waveband selector generally has many operatively coupled members like a memory plate, core slide, tuning knob-side shifting members, kick arm, etc. Therefore, such a conventional link mechanism which links only two members is not suitable for simultaneously coupling such a large number of members. Particularly, when operatively connecting three or more members in the conventional link mechanism, a link is used for the first and second members and another link is further provided for connecting the third member to the first and second members, which means increase of the number of links and accordingly increase of parts of the entire pushbutton-operated waveband selector. This results in difficulty of thinning the waveband selector. Increase of links also means increase of connecting portions between members to cause the loss of power transmission and looseness at the connecting portions. These phenomena give bad influences to the shifting position of the core inside the tuning coil to cause a frequency deviation.

SUMMARY OF THE INVENTION

Accordingly, the present invention has an object to overcome the above-mentioned drawbacks of the link mechanism of the conventional pushbutton-operated waveband or station selector, by providing a novel link mechanism wherein the coupling system is simplified by coupling three members for shifting to different directions from each other on three arms of a three-armed link and power transmission between those members is assured to improve performance of the waveband selector.

Further, the link mechanism according to the present invention will be better understood from the explanation made, by way of example, of the embodiment of the present invention with reference to the accompanying drawings. In the embodiment of the link mechanism according to the present invention, a three-armed link is used as link, of which the first arm is coupled with an idler rack operatively coupled with a tuning knob, the second arm is coupled with a core slide and the third arm is coupled with a memory plate. Further, the idler plate and the memory plate move in parallel but in opposite directions to each other and the core slide moves perpendicularly to the moving direction of the idler plate and the memory plate.

DETAILED DESCRIPTION OF THE PREFERRED EMBODIMENTS

FIGS. 1 through 4 show an embodiment in which the present invention is adopted in a conventional pushbutton-operated waveband or station selector or tuner, illustrating kick arm 12 and memory plate 25 and the link mechanism of the present invention as well. Illustration and explanation of other mechanisms of the pushbutton-operated waveband or station selector are omitted.

Figure 1:
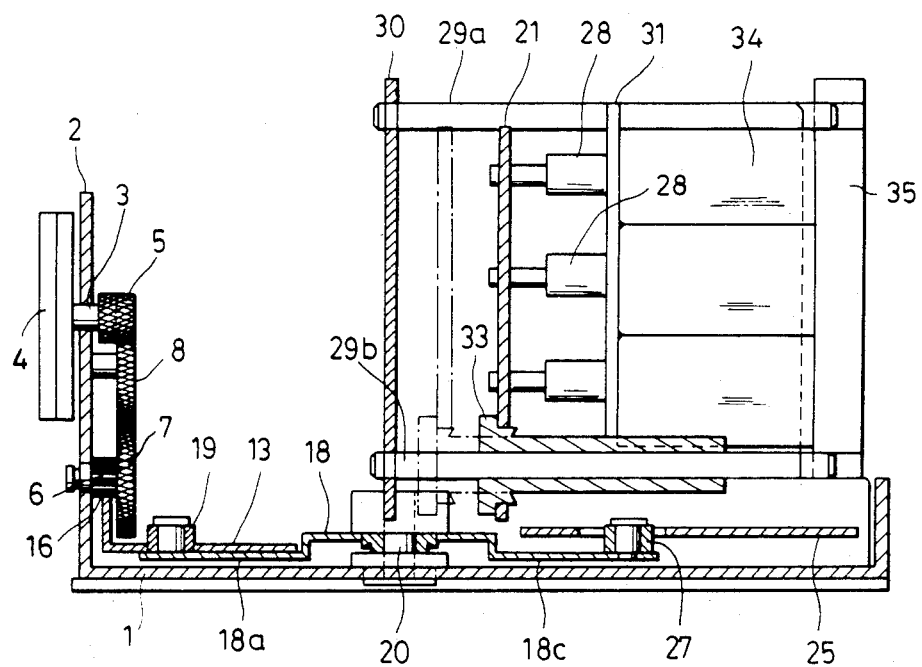
FIG. 1 is an axial-sectional view of an embodiment of the pushbutton-operated waveband or station selector in which the link mechanism according to the present invention is adopted.
Figure 2:
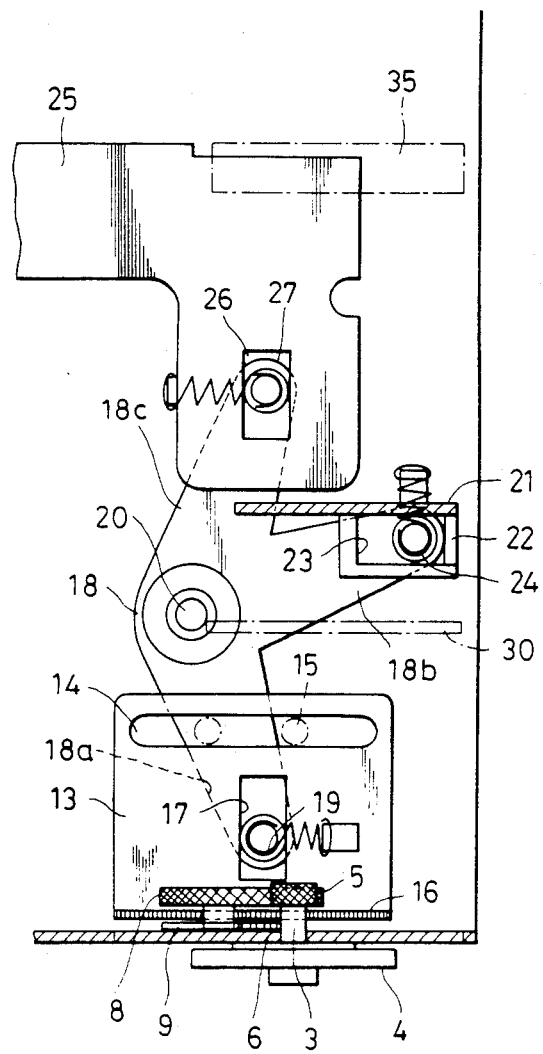
FIG. 2 is a plan view of the embodiment in FIG. 1.
Figure 3:
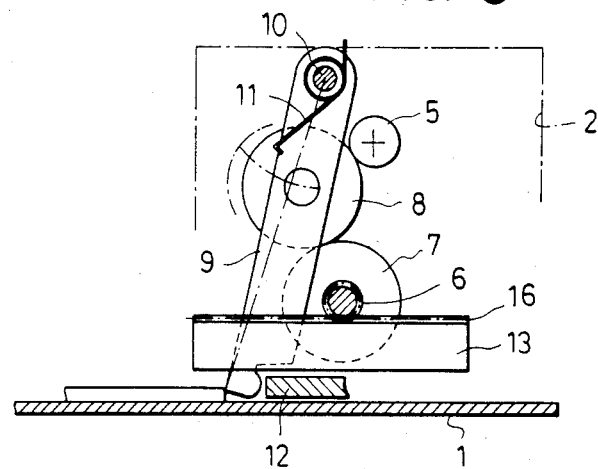
FIG. 3 is a front view of the tuning shaft portion of the embodiment in FIG. 1.

In the Figures, the reference numeral 1 denotes a bottom plate of the apparatus, and 2 a tuning shaft mount plate made of a front vertical upright portion of this bottom plate 1. In the tuning shaft mount plate 2 there is rotatably fitted a tuning shaft 3 at the front end of which a tuning knob 4 is fixed. The rear end of the tuning knob 4 is protruded to the rear side of the mount plate 2. A frictional wheel 5 is fixed to the protrusion of the tuning knob 4. Below the tuning shaft 3 of the mount plate 2 rotatably mounted an idler plate drive gear 6 at the rear end of which another frictional wheel 7 is secured opposite to the frictional wheel 5 of said tuning shaft 3. An idler roller 8 is so disposed between the two frictional wheels 5 and 7 as to freely get in contact with the wheels. This idler roller 8 is rotatably installed on a clutch lever 9 as shown in FIG. 3. The clutch lever 9 is pivotably mounted at the upper end thereof on a pivotal shaft 10 provided on the tuning shaft mount plate 2, and is always forced to the side of tuning shaft 3 by a torsion spring 11 provided on the pivotal shaft so that the idler roller 8 provided on the clutch lever 9 is forced against the frictional wheels 5 and 7. The lower end of the clutch lever 9 is extended to a position near the bottom plate 1 of the apparatus. A kick arm 12 engages at the lower end of the clutch lever 9. As the pushbutton is depressed, the kick arm 12 is moved transversely over the bottom plate 1; when the pushbutton is depressed, the kick arm 12 will force the clutch lever 9 in such a direction as to leave the tuning shaft 3 against the force of the torsion spring 11. There is provided at the rear of the tuning shaft mount plate 2 an idler plate 13 which is guided by a guide hole 14 extending across the idler plate and by a pin 15 inserted in the guide hole 14 to move reciprocally in the direction of the apparatus width. The idler plate 13 has formed at the front edge thereof a rack gear 16 facing upward and which is in mesh with said idler plate drive gear 6. Further, the idler plate 13 has formed therein a guide hole 17 extending longitudinally, in which rotatably fitted is a guide roller 19 provided at the end of the first arm 18a of a three-armed link 18.

The three-armed link 18 is rotatably mounted on a pivotal shaft 20 fixed to the bottom plate 1, and has three arms which are protruded frontward, rearward and laterally, respectively, of the apparatus about the pivotal shaft 20. The first arm 18a is protruded frontward of the apparatus as mentioned above, and has provided at the free end thereof a guide roller 19 which is fitted in the guide hole 17 in the idler plate 13; the second arm 18b of the link 18 is protruded laterally of the apparatus, and has a free end on which a core slide 21 engages. The core slide 21 has provided at the lower end thereof a horizontal coupling plate 22 in which is formed a guide hole 23 extending in the direction of the apparatus width and in which a guide roller 24 provided at the end of the second arm 18b is rotatably fitted. The third arm 18c of the tank 18 is projecting rearward of the apparatus and has coupled at the end thereof a memory plate 25 in which formed is a guide hole 26 extending longitudinally. A guide roller 27 provided at the end of the third arm 18c is rotatably fitted in the guide hole 26. Similar to the memory plate in the conventional thin tuning apparatus, the memory plate 25 is moved laterally of the apparatus over a distance corresponding to the position of the setting plate provided to each of the pushbuttons when the button is depressed.

Figure 4:
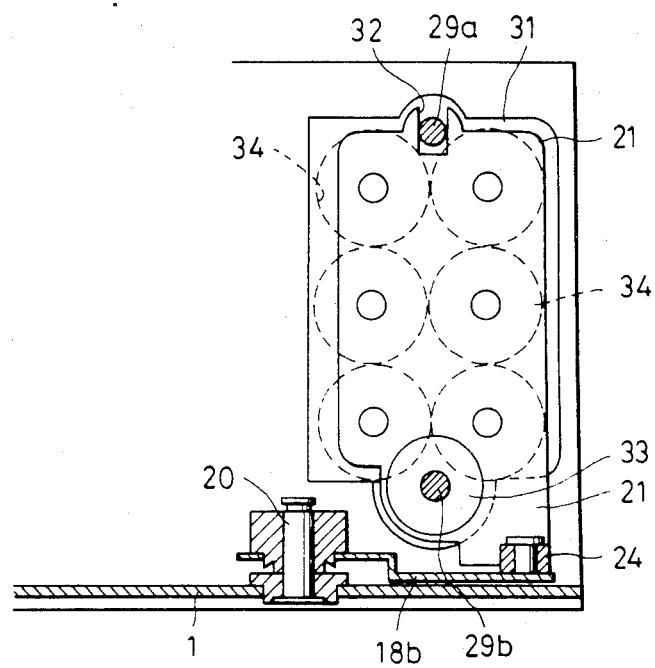
FIG. 4 is a front view of the core slide portion of the embodiment of FIG. 1.

Said core slide 21 is disposed vertically in the pushbutton-operated waveband or station selector; it has horizontally installed at the rear thereof six cores 28, for example; the core slide 21 is slidably installed on the two upper and lower guide shafts 29a and 29b disposed in front-rear direction of the apparatus. These guide shafts 29a and 29b are so installed between a guide shaft mount plate 30 disposed in front of the core slide 21 and a coil mount plate 31 disposed at the back of the core slide 21 as to bridge the mount plates 30 and 31. Further, a concave portion 32 is formed in the upper center of the core slide 21 as shown in FIG. 4, and the upper guide shaft 29a is slidably fitted in the concave portion 32. The core slide 21 has fixed at the lower portion thereof a guide pipe 33 in the front-rear direction of the apparatus. The lower guide shaft 29b is slidably fitted in the guide pipe 33.

There are fixed at the rear of the previously-mentioned coil mount plate 31 tuning coils 34 horizontally in correspondence with the cores 28 which are so inserted in the respective tuning coils 34 as to be moved in front-rear direction. The rear ends of these tuning coils 34 abut on a terminal board 35 for connection of coil lead of each tuning coil. The tuning coils 34 are supported by the coil mount plate 31 and the terminal board 35 from the front and rear, respectively.

Figure 5:
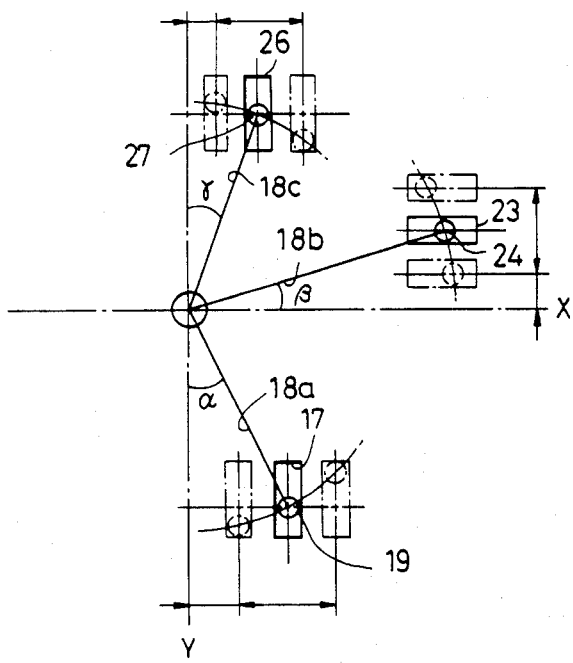
FIG. 5 is a schematic plan view showing the action of the link mechanism as shown by the embodiment of FIG. 1.

According to the present invention, the three arms of the link 18 are coupled with the idler plate 13, core slide 21 and memory plate 25, respectively, with angles between them as shown in FIG. 5. The first arm 18a is extended in a direction inclined at a predetermined angle $\alpha$ with respect to the lateral side of the apparatus (on the core slide side), rather than in a direction perpendicular to the moving direction of the idler plate 13. The second arm 18b is extended rather in a direction inclined at a predetermined angle $\beta$ with respect to the rear side of the apparatus, rather than in a direction perpendicular to the moving direction of the core slide 21. Further, the third arm 18c extends in a direction inclined at a predetermined angle $\gamma$ with respect to the lateral side of the apparatus (on core slide side), rather than in a direction perpendicular to the moving direction of the memory plate 25. Thus, the angles formed by each of the link arms and the moving direction of each of the members coupled with the arm is always greater than a right angle within the rotating range of the link 18 in case of the first and second arms 18a and 18b, while the angle in case of the third arm 18c is always smaller than a right angle; the guide roller provided at the end of each link arm is so set that when the link is pivoted, it is moved from one end to the other of the guide hole formed in the member coupled with the arm.

The pushbutton-operated waveband or station selector adopting the link mechanism according to the present invention is constructed as mentioned in the above, and functions as described below:

For selection of a station or waveband by operating the manual tuning knob 4, the knob 4 is turned to rotate the frictional wheel 5 provided at the end of the tuning shaft 3. Since the idler roller 8 is in forced contact with and between the frictional wheel 5 and the frictional wheel 7 of the idler plate drive gear 6, the rotation of the frictional wheel 5 is transmitted through the idler roller 8 to the frictional wheel 7, thus the idler plate drive gear 6 is rotated. Then, the idler plate 13 in mesh with the idler plate drive gear 6 by means of the rack gear 16 is moved in lateral direction to force the first arm 18a of the link 18 in the lateral direction. As the result, the link 18 pivots about the pivotal shaft 20 so that the end of the second arm 18b of the link 18 is moved in the front-rear direction of the apparatus. Since the core slide 21 is coupled with the end of the second arm 18b of the link by means of the guide hole 23 and guide roller 24, the core slide 21 is moved in the front-rear direction under the guidance of the guide shafts 29a and 29b. Then, the core 28 installed at the rear side of the core slide 21 is also moved in the front-rear direction so that the inserted position of the core inside the tuning coil 34 is changed; thus, the inductance of the tuning circuit 34 is so changed as to provide a tuning with a waveband or station. At the same time, the third arm 18c of the link 18 is moved in the opposite direction so that the memory plate 25 coupled with the end of the third arm 18c is also moved in the lateral direction and stopped at a position corresponding to the inserted position of the core.

On the contrary, when a pushbutton corresponding to a desired station or waveband is depressed, the kick arm 12 is moved as interlocked with the depression of the button and forces the clutch lever 9 against the action of the torsion spring 11 in the opposite direction to the tuning shaft 5. As the result, the idler roller 8 mounted on the clutch lever 9 leaves the frictional wheels 5 and 7 so that the idler rack drive gear 6 and the frictional wheel 7 are freely rotatable as not limited by the tuning shaft 3.

When the memory plate 25 is forced by the setting pin provided in the pushbutton in this condition, the plate 25 is moved in the lateral direction. Then, the third arm 18c of the link 18 coupled with the memory plate 25 by means of the guide hole 26 and guide roller 27 is forced in the lateral direction so that the link 18 is pivoted about the pivotal shaft 20. The end of the second arm 18b of the link 18 is moved in the front-rear direction, thus also the core slide 21 coupled with the end of this arm is moved in the front-rear direction so that the inserted position of the core 28 inside the tuning coil 34 is changed, thus providing a tuning with a desired or selected station or waveband. In this case, since the first arm 18a of the link 18 is coupled with the idler plate 13, also this idler plate 13 is moved in the opposite direction to the memory plate 25. In this case, however, the idler plate 13 will rotate the idler plate drive gear 6 only, not the idler roller 8 and tuning shaft 3. Therefore, the idler plate 13 is smoothly moved and the link 18, core slide 21 and the memory plate 25 coupled with the idler plate 13 are smoothly moved.

In case the core slide is moved by operating the pushbutton or tuning knob in this way, the three-armed link coupled with these members acts as follows: That is, when the core slide 21 is positioned at the frontmost position of the apparatus, the guide roller 24 provided at the end of the second arm 18b is positioned at the outermost position of the guide hole 23 in the core slide. On the other hand, the guide rollers 19 and 27 provided at the ends of the first and third arms 18a and 18b, respectively, are positioned at the front ends of the guide holes 17 and 26 in the idler plate 13 and memory plate 25, respectively. When the tuning shaft 3 is turned to move the idler plate 13 outwardly of the apparatus or when a pushbutton is depressed to move the memory plate 25 inwardly of the apparatus, in this condition, the link 18 is pivoted about the pivotal shaft 20 as forced by the idler plate 13 or memory plate 25. In this case, the guide roller 19 provided on the first arm 18a of the link 18 and the guide roller 27 provided on the third arm 18c are moved from the front end toward the rear end of the guide hole 17 or 26, delineating an arcuate orbit, respectively. At the same time, the guide roller 24 provided at the end of the second arm 18c of the link 18 forces the core slide 21 while delineating an arcuate orbit, and moves from the outer end toward the inner end of the guide hole 23. When the link 18 pivots a full turn so that each of the members coupled with the link is moved over the entire stroke, each of the guide rollers moves from one end to another of the guide hole in which it is fitted, while no reciprocal movement of them occurs in the guide holes; therefore no point of inflection appears.

As having been described in the foregoing, the link mechanism according to the present invention is so constructed that three members operatively connected to each other are connected by a three-armed link so as to shift simultaneously, permitting reduction of links for operatively connecting various members as compared with the conventional waveband selector, and accordingly, simplification, miniaturization and thinning of the waveband selector. Further, such linkage of three members by a single three-armed link allows simultaneous and smooth movements of the members. Therefore, according to the present invention, movements of those members and the core slide for being shifted through the link can be so stabilized that the stop position of the core fitted on the core slide may be properly determined to thereby prevent a frequency deviation.

It should be noted that the present invention is not limited to the embodiment having been illustrated in the drawings; for example, other three members like a kick arm and shifting plate for an indicating mechanism as being adequately combined may be connected to the three-armed link instead of the three members shown in the embodiment. Further, moving directions of the three members are not limited to ones of the illustrated embodiment. That is, only if the three members may move in different directions from each other, they need not move perpendicularly or in parallel. Link means for connecting the link and the members is not limited to the elongated guide holes and guide rollers. For example, pins may be used instead of the guide rollers and groove-like guide portions may be formed instead of the guide holes.

I claim:

1. In a tuner having a pushbutton-operated waveband or station selector in which the tuner has pushbuttons for making station selections, a rotatable tuning knob for making station selections alternatively with the pushbuttons, tuning coil means and tuning core means movable in said tuning coil means and operable by the pushbuttons and the tuning knob for tuning in stations, the combination coprising: a slidable memory plate movable back and forth in a first directiion between a plurality of positions which are selectable by operation of said pushbuttons, said first direction extending laterally to the direction of movement of the pushbuttons, and a first elongated guide portion on said memory plate and extending perpendicular to said first direction; a slidable core slide connected to the tuning core means and movable back and forth in a second direction for tuning in stations, said second direction being different from said first direction, and a second elongated guide portion on said core slide and extending perpendicular to said second direction; a slidable idler plate movable in said first direction in response to rotation of the tuning knob, and a third elongated guide portion on said idler plate and extending perpendicular to said first direction; a link having first, second and third arms and means mounting said link for pivotal movement on said tuner, each of said arms having a guide member thereon spaced outwardly from the pivot axis of said link, the guide member on said first arm being slidably received in said third guide portion, the guide member on said second arm being slidably received in said second guide portion and the guide member on said third arm being slidably received in said first guide portion so that movement of said memory plate or said idler plate in the first direction will pivot the link and thereby effect movementof said core slide in the second direction.

2. A tuner as claimed in claim 1 in which said means mounting said link for pivotal movement comprises a centrally located pivot pin, said first and third arms extending in substantially opposite directions away from said pivot pin and said second arm extending away from said pivot pin in a direction transverse to said first and third arms, said first, second and third elongated guide portions comprising first, second and third elongated guide holes extending through said memory plate, said core slide and said idler plate, respectively, and said guide members are guide rollers slidably received in said guide holes; whereby pivoting of said link effects corresponding movement of said memory plate and said idler plate in opposite directions and movement of said core slide in a direction perpendicular thereto.

3. A tuner as claimed in claim 1 or claim 2 in which said first and third arms extend in opposite directions away from the pivot axis of said link, each of said first and third arms extending at an angle larger than a right angle relative to an imaginary line that passes through the pivot axis of said link and extends parallel to said first direction, and said second arm extends at an angle smaller than a right angle relative to said imaginary line.

4. A tuner as claimed in claim 1 in which said tuning knob has a first friction wheel connected thereto for rotation therewith, a second rotatable friction wheel having a drive gear connected thereto for rotation therewith, said idler plate having a rack drivingly engaged with said drive gear, a rotatable idler roller and means supporting said idler roller for pivotal movement between a first position in which said idler roller simultaneously drivingly engages said first and second friction wheels and a second position in which said idler roller is disengaged from at least one of said friction wheels, and a slidable kick plate for moving said idler roller to said second position when one of the pushbuttons is actuated to make a station selection.

* * * * *